(12) United States Patent
Wada

(10) Patent No.: US 8,138,807 B2
(45) Date of Patent: Mar. 20, 2012

(54) POWER-ON DETECTING CIRCUIT AND LEVEL CONVERTING CIRCUIT

(75) Inventor: Masaharu Wada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 390 days.

(21) Appl. No.: 12/388,755

(22) Filed: Feb. 19, 2009

(65) Prior Publication Data

US 2009/0261885 A1    Oct. 22, 2009

(30) Foreign Application Priority Data

Apr. 18, 2008   (JP) ................................. 2008-109140

(51) Int. Cl.
*H03L 7/00*    (2006.01)

(52) U.S. Cl. ........................................ 327/143; 327/333
(58) Field of Classification Search .................. 327/143, 327/333; 326/68, 80, 81; 365/189.11
See application file for complete search history.

(56) References Cited

U.S. PATENT DOCUMENTS

| 6,483,756 | B2 | 11/2002 | Takeuchi et al. |
| 6,888,384 | B2 | 5/2005 | Wada |
| 7,366,048 | B2 * | 4/2008 | Byeon ..................... 365/189.11 |
| 7,573,306 | B2 * | 8/2009 | Kumazaki et al. ............ 327/143 |

FOREIGN PATENT DOCUMENTS

JP    2005-286675    10/2005

* cited by examiner

*Primary Examiner* — Long Nguyen
(74) *Attorney, Agent, or Firm* — Turocy & Watson, LLP

(57) ABSTRACT

When a low supply potential has risen while a high supply potential has not risen, a logical value "0" is output as an output signal by applying a ground potential to an input terminal of a latch circuit through a capacitor. On the other hand, when the high supply potential has risen while the low supply potential has not risen, a logical value "0" is output as an output signal by converting the high supply potential into the ground potential by the level shifter. If both the low supply potential and the high supply potential have risen, the logical value "1" is output as an output signal by converting the ground potential into the high supply potential by the level shifter.

12 Claims, 3 Drawing Sheets

US 8,138,807 B2

POWER-ON DETECTING CIRCUIT AND LEVEL CONVERTING CIRCUIT

CROSS-REFERENCE TO RELATED APPLICATIONS

This application is based upon and claims the benefit of priority from the prior Japanese Patent Application No. 2008-109140, filed on Apr. 18, 2008; the entire contents of which are incorporated herein by reference.

BACKGROUND OF THE INVENTION

1. Field of the Invention

The present invention relates to a power-on detecting circuit and a level converting circuit. More particularly, the present invention relates to a power-on detecting circuit and a level converting circuit that can stably detect a rise of a plurality of differing supply potentials without depending on an application sequence or a rise time of the supply potentials.

2. Description of the Related Art

Some semiconductor circuits, such as level converting circuits, operate at a plurality of supply potentials. A through current flows in such semiconductor circuits when an input potential does not rise sufficiently at a rise of a supply potential, particularly, when the input potential is a medium potential relative to the supply potential. Flow of a through current in a semiconductor circuit can lead to increase in power consumption, lowering of an output potential of a power supply circuit, or hinder a normal start of a system.

JP-A 2005-286675 (KOKAI) discloses a method of activating a plurality of input/output circuits with supply voltages larger than a first supply voltage, which activates an internal circuit, to enable stable operation of a circuit compatible with a plurality of supply voltages, without depending on an application sequence of the supply voltages. Specifically, a level shift circuit is provided that converts signal amplitude corresponding to the first supply voltage to signal amplitude corresponding to each of the supply voltages, and a first control signal is formed by a plurality of power detecting circuits until the first supply voltage and the supply voltages reach respective predetermined levels to control an operation of the input/output circuit to a predetermined operation corresponding thereto.

However, in the method disclosed in JP-A 2005-286675 (KOKAI), the supply voltage of the input/output circuit is used to detect the supply voltage of the internal circuit. This method works well when the supply voltage of the internal circuit has risen after the supply voltage of the input/output circuit has risen. However, this method does not work well when the supply voltage of the internal circuit rises before the supply voltage of the input/output circuit has risen.

BRIEF SUMMARY OF THE INVENTION

According to an aspect of the present invention, there is provided a power-on detecting circuit including a level shifter that, when a high supply potential has risen, converts the ground potential into the high supply potential and outputs the high supply potential when a ground potential is input, and converts the high supply potential into the ground potential and outputs the ground potential when the high supply potential is input; an input circuit that inputs the high supply potential to the level shifter when a low supply potential has not risen, and that inputs the ground potential to the level shifter when the low supply potential has risen; and an output circuit that is connected on an output side of the level shifter, and that outputs the ground potential when the high supply potential has not risen.

According to another aspect of the present invention, there is provided a power-on detecting circuit including a first power-on detecting circuit that outputs a logical value "1" when both of N-th and (N+1)-th, where N is an integer equal to or larger than 1, highest potentials have risen, and that outputs a logical value "0" when only either one of the N-th and the (N+1)-th highest potential has risen; and a second power-on detecting circuit that is connected in a subsequent stage to the first power-on detecting circuit, that outputs a logical value "1" when both of the (N+1)-th and the (N+2)-th highest potentials have risen, and that outputs a logical value "0" when only either one of the (N+1)-th and the (N+2)-th highest potential has risen.

According to still another aspect of the present invention, there is provided a level converting circuit including a power-on detecting circuit that outputs a logical value "1" when a low supply potential and a high supply potential have both risen, and that outputs a logical value "0" when only one of the low supply potential and the high supply potential has risen; a first level shifter that converts an input potential into any one of a low potential and a high potential to output; a pull-up transistor that is controlled to be turned on and off based on an output signal of the power-on detecting circuit, and that fixes an output potential of the first level shifter to any one of the low potential and the high potential; and a leakage-cut transistor that is controlled to be turned on and off based on an output signal of the power-on detecting circuit, and that blocks a through current that flows in the first level shifter.

DETAILED DESCRIPTION OF THE INVENTION

Exemplary embodiments of a power-on detecting circuit according to the present invention will be explained below in detail with reference to the accompanying drawings.

First Embodiment

Figure 1:
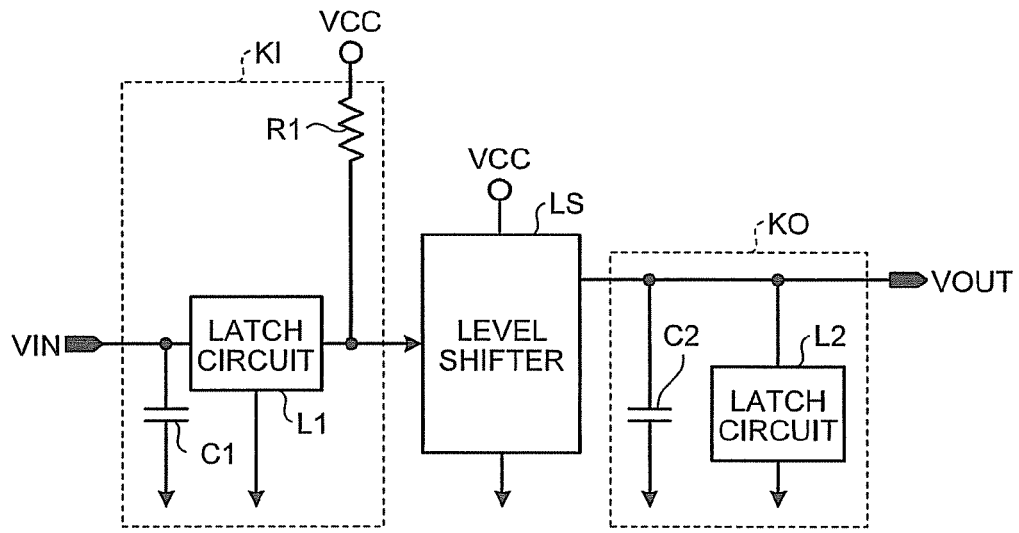
FIG. 1 is a block diagram of a power-on detecting circuit according to a first embodiment of the present invention.

FIG. 1 is a block diagram of a power-on detecting circuit according to a first embodiment of the present invention.

As shown in FIG. 1, the power-on detecting circuit includes an input circuit KI, an output circuit KO, and a level shifter LS. The input circuit KI is connected on an input side of the level shifter LS, and the output circuit KO is connected on an output side of the level shifter LS. The level shifter LS is activated by a high supply potential VCC. If a ground potential GND is input when the high supply potential VCC is rising, the level shifter LS converts the ground potential GND to the high supply potential VCC to output. On the other hand, if the high supply potential VCC is input when the high supply potential VCC is rising, the level shifter LS convert the high supply potential VCC to the ground potential GND to output. That is, the level shifter LS functions as an inverter when the high supply potential VCC is rising.

The input circuit KI inputs the high supply potential VCC to the level shifter LS when a low supply potential VDD has not risen. On the other hand, the input circuit KI inputs the ground potential GND to the level shifter LS when the low supply potential VDD has risen. The output circuit KO outputs the ground potential GND when the high supply potential VCC has not risen. The high supply potential VCC can be set to, for example, 3.3 volts, and the low supply potential VDD can be set to, for example, 1.2 volts.

The input circuit KI includes a latch circuit L1, a capacitor C2, and a resistor R1. Particularly, an input terminal of the latch circuit L1 is connected to the ground potential GND through the capacitor C1, and an output terminal of the latch circuit L1 is connected to an input terminal of the level shifter LS. The resistor R1 is connected between the input terminal of the level shifter LS and the high supply potential VCC.

The latch circuit L1 maintains and outputs the ground potential GND when the low supply potential VDD is input to it, and outputs high impedance when the ground potential GND is input to it. The capacitor C1 supplies the ground potential GND to the input terminal of the latch circuit L1 when the low supply potential VDD has not risen.

The output circuit KO includes a latch circuit L2 and a capacitor C2. An input terminal and an output terminal of the latch circuit L2 are connected in common, and the input terminal of the latch circuit L2 is connected to the output terminal of the level shifter LS. In addition, the input terminal of the latch circuit L2 is connected to the ground potential GND through the capacitor C2.

The latch circuit L2 maintains an input as it is to be output, when the low supply potential VDD has risen. The capacitor C2 supplies the ground potential GND to the input terminal of the latch circuit L2 when the high supply potential VCC has not risen.

An electronic element other than the resistor R1 that can drop the high supply potential VCC can be connected between the input side of the level shifter LS and the high supply potential VCC. Such an electronic element can be an active load such as a transistor.

The low supply potential VDD is supplied as an input signal VIN. If the low supply potential VDD has risen when the high supply potential VCC has not risen, the input of the latch circuit L1 is the low supply potential VDD, and the output is maintained at the ground potential GND to be input to the level shifter LS. Because the high supply potential VCC has not risen, the output of the level shifter LS is irregular. When the output of the level shifter LS is irregular, the ground potential GND is supplied to the input terminal of the latch circuit L2 through the capacitor C2. The latch circuit L2 maintains the ground potential GND and outputs as it is, thereby outputting a logical value "0" as an output signal VOUT.

Furthermore, if the high supply potential VCC has risen while the low supply potential VDD has not risen, the ground potential GND is supplied to the input terminal of the latch circuit L1 through the capacitor C1, and the output of the latch circuit L1 becomes high impedance. As a result, the high supply potential VCC is applied to the input terminal of the level shifter LS through the resistor R1, and is converted into the ground potential GND to be output. The latch circuit L2 outputs the ground potential GND as it is, thereby outputting the logical value "0" as the output signal VOUT.

Moreover, if the low supply potential VDD and the high supply potential VCC have both risen, the input of the latch circuit L1 is the low supply potential VDD, and the output is maintained at the ground potential GND to be input to the level shifter LS. When the ground potential GND is input to the level shifter LS, the ground potential GND is converted into the high supply potential VCC to be output. The latch circuit L2 outputs the high supply potential VCC as it is, thereby outputting a logical value "1" as the output signal VOUT.

With such an arrangement, the logical value "1" can be output as the output signal VOUT only when both the low supply potential VDD and the high supply potential VCC have risen. As a result, the rise of the low supply potential VDD and the high supply potential VCC can be stably detected without depending on the application sequence or the rise time of the low supply potential VDD and the high supply potential VCC. Therefore, it becomes possible to activate a level converting circuit that converts a low potential to a high potential after both the low supply potential VDD and the high supply potential VCC have risen, and to prevent a through current from flowing in the level converting circuit even when the input potential does not rise sufficiently at the rise of the output potential. Thus, power consumption can be reduced.

In an alternative configuration, a driving transistor can be provided that brings the input of the level shifter LS up to the high supply potential VCC by such an arrangement that the driving transistor is turned off when the low supply potential VDD has risen and is turned on when the high supply potential VCC has risen while the low supply potential VDD has not risen. Such a driving transistor can be provided in the level shifter LS, or independently from the level shifter LS.

By providing such a driving transistor, even when the resistor R1 has high resistance, the input of the level shifter LS can be brought up to the high supply potential VCC at high speed when the high supply potential VCC has risen. Thus, a high speed operation can be achieved.

Second Embodiment

Figure 2:
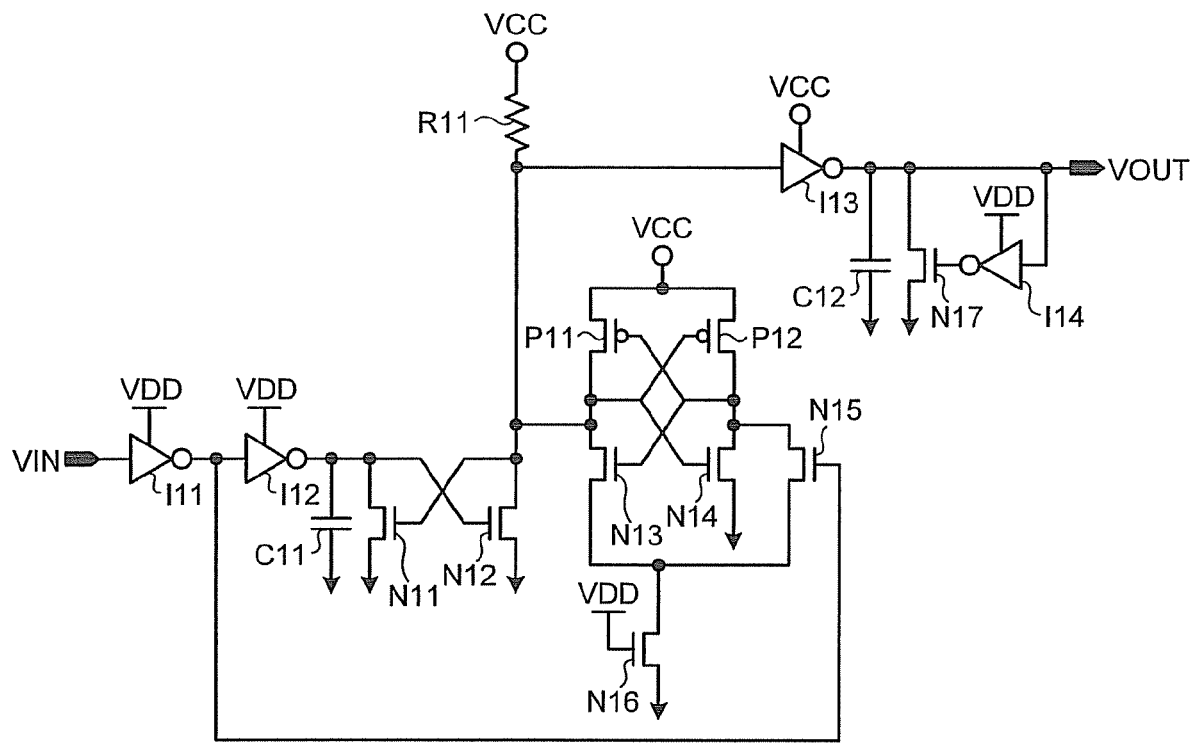
FIG. 2 is a circuit diagram of a power-on detecting circuit according to a second embodiment of the present invention.

FIG. 2 is a circuit diagram of a power-on detecting circuit according to a second embodiment of the present invention.

As shown in FIG. 2, in this power-on detecting circuit, inverters I11, I12, and I14 are activated by the low supply potential VDD, and an inverter I13 is activated by the high supply potential VCC. An output terminal of the inverter I11 is connected to an input terminal of the inverter I12, and an output terminal of the inverter I12 is grounded through a capacitor C11. Moreover, a drain of an N-channel field effect transistor (FET) N11 is connected to a gate of an N-channel FET N12, and to an output terminal of the inverter I12. A drain of the N-channel FET N12 is connected to a gate of the N-channel FET N11, and to the high supply potential VCC through a resistor R11. Furthermore, the drain of the N-channel FET N12 is connected to an input terminal of the inverter I13, and an output terminal of the inverter I13 is grounded through a capacitor C12. Moreover, the output terminal of the inverter I13 is connected to a drain of an N-channel FET N17, and to an input terminal of an inverter I14. An output terminal of the inverter I14 is connected to a gate of the N-channel FET N17.

Moreover, sources of P-channel FETs P11 and P12 are connected to the high supply potential VCC. A drain of the P-channel FET P11 is connected to the drain of the N-channel FET is connected to the drain of the N-channel FET N12 and a drain of an N-channel FET N13, to a gate of the P-channel FET P12, and to a gate of an N-channel FET N14. Furthermore, a drain of the P-channel FET P12 is connected to drains of the N-channel FET N14 and an N-channel FET N15, to a gate of the P-channel FET P11, and to a gate of the N-channel FET N13.

Furthermore, a gate of the N-channel FET N15 is connected to the output terminal of the inverter I11, sources of the N-channel FETs N13 and N15 are connected to a drain of an N-channel FET N16, and a gate of the N-channel FET N16 is connected to the low supply potential VDD.

The N-channel FETs N11 and N12 constitute the latch circuit L1 shown in FIG. 1. Furthermore, the inverter I14 and the N-channel FET N17 constitute the latch circuit L2 shown in FIG. 1. The inverter I13 constitutes the level shifter LS shown in FIG. 1. Moreover, the P-channel FETs P11 and P12 and the N-channel FETs N13 and N14 constitute a driving circuit that brings the input side of the inverter I13 up to the high supply potential VCC.

To the input terminal of the inverter I11, the low supply potential VDD, or a reset signal PORn, can be applied as an input signal VIN.

It is assumed here that the low supply potential VDD is applied as the input signal VIN. When the low supply potential VDD has risen while the high supply potential VCC has not risen, the low supply potential VDD is applied to the gate of the N-channel FET N12 through the inverters I11 and I12 sequentially, whereby the N-channel FET N12 is turned on. In this situation, the drain of the N-channel FET N12 attains the ground potential GND. Because the high supply potential VCC has not risen, the output of the inverter I13 becomes irregular. When the output of the inverter I13 is irregular, the ground potential GND is applied to the input terminal of the inverter I14 through the capacitor C12. When the ground potential GND is applied to the input terminal of the inverter I14, the output of the inverter I14 is to be the low supply potential VDD, and the N-channel FET N17 is turned on. Thus, the output of the inverter I13 is maintained at the ground potential GND as it is, thereby outputting the logical value "0" as the output signal VOUT.

On the other hand, when the drain of the N-channel FET N12 attains the ground potential GND, the P-channel FET P12 is turned on. Because the high supply potential VCC has not risen, the potential of the drain of the P-channel FET P12 becomes irregular. Therefore, the potential of the gates of the P-channel FET P11 and the N-channel FET N13 become irregular, and the drain of the N-channel FET N12 maintains the ground potential GND as it is.

Furthermore, if the high supply potential VCC has risen when the low supply potential VDD has not risen, the output of the inverter I12 becomes irregular. When the output of the inverter I12 is irregular, the ground potential GND is applied to the gate of the N-channel FET N12 through the capacitor C11. When the ground potential GND is applied to the gate of the N-channel FET N12, the N-channel FET N12 is turned off. In the situation that the N-channel FET N12 is off, the high supply potential VCC is applied to the drain of the N-channel FET N12 through the resister R11, and the high supply potential VCC is applied to the input terminal of the inverter I13. When the high supply potential VCC is applied to the input terminal of the inverter I13, the ground potential GND is output from the output terminal of the inverter I13. When the output of the inverter I13 attains the ground potential GND, the ground potential GND is applied to the input terminal of the inverter I14, and the output of the inverter I14 becomes the high supply potential VCC. When the output of the inverter I14 becomes the high supply potential VCC, the N-channel FET N17 is turned on. Thus, the output of the inverter I13 is maintained at the ground potential GND, thereby outputting the logical value "0" as the output signal VOUT.

On the other hand, when the drain of the N-channel FET N12 becomes the high supply potential VCC, the N-channel FET N14 is turned on, and the drain of the N-channel FET N14 becomes the ground potential GND. When the drain of the N-channel FET N14 becomes the ground potential GND, the gate of the P-channel FET P11 becomes the ground potential GND, and the P-channel FET P11 is turned on. When the P-channel FET P11 is turned on, the drain of the N-channel FET N12 is maintained at the high supply potential VCC. By turning on the P-channel FET P11, the drain of the N-channel FET N12 can be speedily brought up to the high supply potential VCC even when the resistor R11 has high resistance, thereby achieving a high speed operation.

Moreover, when both the low supply potential VDD and the high supply potential VCC have risen, the low supply potential VDD is applied to the gate of the N-channel FET N12 through the inverters I11 and I12. Upon turning on the N-channel FET N12, the drain of the N-channel FET N12 becomes the ground potential GND, and the ground potential GND is applied to the input terminal of the inverter I13. When the ground potential GND is applied to the input terminal of the inverter I13, the output of the inverter I13 becomes the high supply potential VCC, and the high supply potential VCC is applied to the input terminal of the inverter I14. When the high supply potential VCC is applied to the input terminal of the inverter I14, the output of the inverter I14 becomes the low supply potential VDD. Upon turning off the N-channel FET N17, the output of the inverter I13 is maintained at the high supply potential VCC as it is, thereby outputting the logical value "1" as the output signal VOUT.

On the other hand, when the drain of the N-channel FET N12 becomes the ground potential GND, the P-channel FET P12 is turned on, and the drain of the P-channel FET P12 becomes the high supply potential VCC. When the drain of the P-channel FET P12 becomes the high supply potential VCC, the gate of the N-channel FET N13 becomes the high supply potential VCC. Upon turning on the N-channel FET N13, the drain of the N-channel FET N13 becomes the ground potential GND, and the drain of the N-channel FET N12 maintains the ground potential GND as it is.

Now assume that the reset signal PORn is applied as the input signal VIN. The reset signal PORn is input from a power source system of the low supply potential VDD, and functions after the low supply potential VDD has risen.

When the level of the reset signal PORn is low while both the low supply potential VDD and the high supply potential VCC have risen, the output of the inverter I11 becomes high level, and the high level is applied to the gate of the N-channel FET N15. Thus, the N-channel FET N15 is turned on. Moreover, when the low supply potential VDD has risen, the N-channel FET N16 is turned on.

When both the N-channel FETs N15 and N16 are turned on, the drain of the N-channel FET N14 becomes the ground potential GND. When the drain of the N-channel FET N14 becomes the ground potential GND, the gate of the P-channel FET P11 becomes the ground potential GND, and the P-channel FET P11 is turned on. When the P-channel FET P11 is turned on, the drain of the N-channel FET N12 is maintained at the high supply potential VCC. When the P-channel FET P11 is turned on, the drain of the N-channel FET N12 can be speedily brought up to the high supply potential VCC even when the resistor R11 has high resistance, thereby achieving a high speed operation.

When the drain of the N-channel FET N12 becomes the high supply potential VCC, the high supply potential VCC is applied to the input terminal of the inverter I13. When the high supply potential VCC is applied to the input terminal of the inverter I13, the ground potential GND is output from the output terminal of the inverter I13. When the output of the inverter I13 becomes the ground potential GND, the ground potential GND is applied to the input terminal of the inverter I14, and the output of the inverter I14 becomes the high supply potential VCC. When the output of the inverter I14 becomes the high supply potential VCC, the N-channel FET N17 is turned on. Thus, the output of the inverter I13 is maintained at the ground potential GND as it is, thereby outputting the logical value "0" as the output signal VOUT.

Furthermore, when the level of the reset signal PORn is low, the output of the inverter I12 becomes low level, and the gate of the N-channel FET N12 becomes low level. Therefore, the N-channel FET N12 is turned off. When the N-channel FET N12 is turned off, the high supply potential VCC is applied to the drain of the N-channel FET N12 through the resistor R11.

On the other hand, when the level of the reset signal PORn is high, the output of the inverter I12 becomes high level, and the gate of the N-channel FET N12 becomes high level. Therefore, the N-channel FET N12 is turned on. When the N-channel FET N12 is turned on, the ground potential GND is applied to the drain of the N-channel FET N12, and the ground potential GND is applied to the input terminal of the inverter I13. When the ground potential GND is applied to the input terminal of the inverter I13, the output of the inverter I13 becomes the high supply potential VCC, and the high supply potential VCC is applied to the input terminal of the inverter I14. When the high supply potential VCC is applied to the input terminal of the inverter I14, the output of the inverter I14 becomes the low supply potential VDD, and the N-channel FET N17 is turned off. Thus, the output of the inverter I13 is maintained at the high supply potential VCC as it is, thereby outputting the logical value "1" as the output signal VOUT.

Moreover, when the level of the reset signal PORn is high, the output of the inverter I11 becomes low level, and the low level is applied to the gate of the N-channel FET N15. Thus, the N-channel FET N15 is turned off.

When the drain of the N-channel FET N12 becomes the ground potential GND, the P-channel FET P12 is turned on, and the drain of the P-channel FET P12 becomes the high supply potential VCC. When the drain of the P-channel FET P12 becomes the high supply potential VCC, the gate of the N-channel FET N13 becomes the high supply potential VCC, and the N-channel FET N13 is turned on. The drain of the N-channel FET N13 becomes the ground potential GND, and the drain of the N-channel FET N12 is maintained at the ground potential GND.

Third Embodiment

Figure 3:
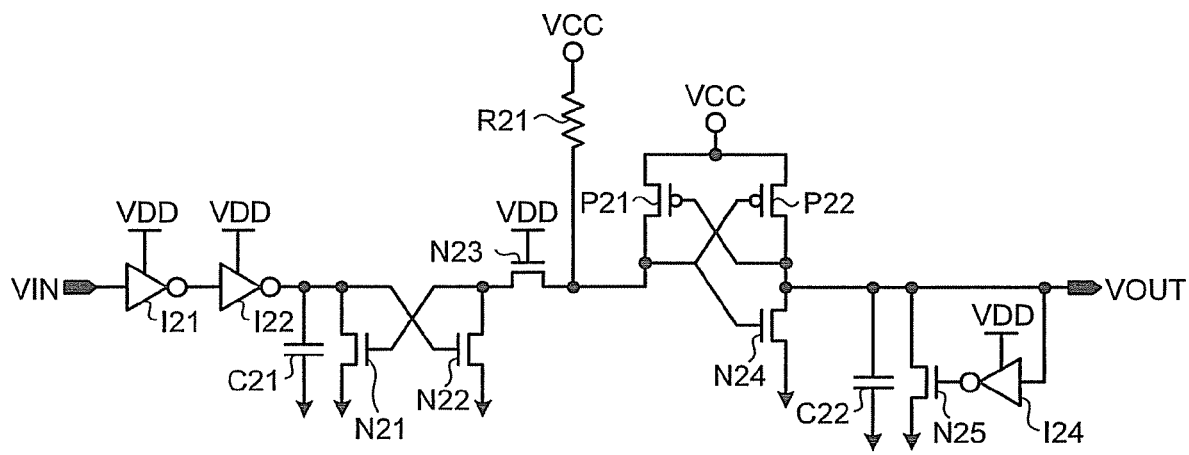
FIG. 3 is a circuit diagram of a power-on detecting circuit according to a third embodiment of the present invention.

FIG. 3 is a circuit diagram of a power-on detection circuit according to a third embodiment of the present invention.

As shown in FIG. 3, in this power-on detection circuit, inverters I21, I22, and I24 are activated by the low supply potential VDD. An output terminal of the inverter I21 is connected to an input terminal of the inverter I22, and an output terminal of the inverter I22 is grounded through a capacitor C21. A drain of an N-channel FET N21 is connected to a gate of an N-channel FET N22 and to an output terminal of the inverter I22, and a drain of the N-channel FET N22 is connected to a gate of the N-channel FET N21 and to a drain of a P-channel FET P21 through an N-channel FET N23. The drain of the P-channel FET P21 is connected to the high supply potential VCC through a resistor R21, and a gate of the N-channel FET N23 is connected to the low supply potential VDD.

Moreover, sources of the P-channel FET P21 and a P-channel FET P22 are connected to the high supply potential VCC. The drain of the P-channel FET P21 is connected to a gate of the P-channel FET P22 and a gate of an N-channel FET N24. Furthermore, a drain of the P-channel FET P22 is connected to a gate of the P-channel FET P21.

Furthermore, a drain of the N-channel FET N24 is connected to an input terminal of the inverter I24, and the input terminal of the inverter I24 is grounded through a capacitor C22. An output terminal of the inverter I24 is connected to a gate of an N-channel FET N25, and a drain of the N-channel FET N25 is connected to the input terminal of the inverter I24.

The N-channel FETs N21 and N22 can form the latch circuit L1 shown in FIG. 1. Moreover, the inverter I24 and the N-channel FET N25 can form the latch circuit L2 shown in FIG. 1. The P-channel FET P22 and the N-channel FET N24 can form the level shifter LS shown in FIG. 1. Moreover, the P-channel FET P21 can form a driving circuit that brings the potential of the gates of the P-channel FET P22 and the N-channel FET N24 up to the high supply potential VCC.

To the input terminal of the inverter I21, the low supply potential VDD or the reset signal PORn can be applied as an input signal VIN.

The low supply potential VDD is applied as the input signal VIN. If the low supply potential VDD has risen when the high supply potential VCC has not risen, the low supply potential VDD is applied to the gate of the N-channel FET N22 through the inverters I21 and I22 sequentially, and the N-channel FET N22 is turned on. When the N-channel FET N22 is turned on, the drain of the N-channel FET N22 becomes the ground potential GND. The ground potential GND is applied to the drain of the P-channel FET P21 through the N-channel FET N23, and is further applied to the gate of the P-channel FET P22 and the gate of the N-channel FET N24.

Because the high supply potential VCC has not risen, the potential of the drain of the P-channel FET P22 is to be irregular even when the ground potential GND is applied to the gate of the P-channel FET P22. When the potential of the drain of the P-channel FET P22 is irregular, the ground potential GND is applied to the input terminal of the inverter I24 through the capacitor C22. When the ground potential GND is applied to the input terminal of the inverter I24, the output of the inverter I24 is to be the low supply potential VDD, and the N-channel FET N25 is turned on. Thus, the input terminal of the inverter I24 is maintained at the ground potential GND as it is, and the logical value "0" is output as the output signal VOUT.

When the high supply potential VCC has risen while the low supply potential VDD has not risen, the output of the inverter I22 is irregular. When the output of the inverter I12 is irregular, the ground potential GND is applied to the gate of the N-channel FET N22 through the capacitor C21. When the ground potential GND is applied to the gate of the N-channel FET N22, the N-channel FET N22 is turned off. Upon turning off the N-channel FET N22, the high supply potential VCC is applied to the drain of the P-channel FET P21 through the resister R21, and is further applied to the gate of the P-channel FET P22 and the gate of the N-channel FET N24.

When the high supply potential VCC is applied to the gate of the N-channel FET N24, the N-channel FET N24 is turned on, and the ground potential GND is applied to the input terminal of the inverter I24, and the output of the inverter I24 becomes the high supply potential VCC. When the output of the inverter I24 becomes the high supply potential VCC, the N-channel FET N25 is turned on. Thus, the input terminal of the inverter I24 is maintained at the ground potential GND as it is, thereby outputting the logical value "0" as the output signal VOUT.

Furthermore, when the N-channel FET N24 is turned on, the potential of the drain of the N-channel FET N24 becomes the ground potential GND, and the ground potential GND is applied to the gate of the P-channel FET P21. When the ground potential GND is applied to the P-channel FET P21, the P-channel FET P21 is turned on. When the P-channel FET P21 is turned on, the drain of the P-channel FET P21 is maintained at the high supply potential VCC. When the P-channel FET P21 is turned on, the drain of the N-channel FET N21 can be speedily brought up to the high supply potential VCC even when the resistor R21 has high resistance, thereby achieving a high speed operation.

Moreover, when both the low supply potential VDD and the high supply potential VCC have risen, the low supply potential VDD is applied to the gate of the N-channel FET N22 through the inverters I21 and I22 sequentially, and the N-channel FET N22 is turned on. When the N-channel FET N22 is turned on, the drain of the N-channel FET N22 becomes the ground potential GND, and the ground potential GND is applied to the drain of the P-channel FET P21 through the N-channel FET N23, and is applied further to the gate of the P-channel FET P22 and the gate of the N-channel FET N24.

When the ground potential GND is applied to the gate of the P-channel FET P22, the drain of the P-channel FET P22 becomes the high supply potential VCC, and the high supply potential VCC is applied to the input terminal of the inverter I24. When the high supply potential VCC is applied to the input terminal of the inverter I24, the output of the inverter I24 becomes the low supply potential VDD. The N-channel FET N25 is turned off, and the input terminal of the inverter I24 is maintained at the high supply potential VCC as it is, thereby outputting the logical value "1" as the output signal VOUT.

On the other hand, the reset signal PORn is applied as the input signal VIN. The reset signal PORn is input from a power source system of the low supply potential VDD, and functions after the low supply potential VDD has risen.

When the level of the reset signal PORn is low while both the low supply potential VDD and the high supply potential VCC have risen, the output of the inverter I22 becomes low level, and the N-channel FET N22 is turned off. When the N-channel FET N22 is turned off, the high supply potential VCC is applied to the drain of the P-channel FET P21, and is applied further to the gate of the P-channel FET P22 and the gate of the N-channel FET N24.

When the high supply potential VCC is applied to the gate of the N-channel FET N24, the N-channel FET N24 is turned on, and the ground potential GND is applied to the input terminal of the inverter I24, and the output of the inverter I24 becomes the high supply potential VCC. When the output of the inverter I24 becomes the high supply potential VCC, the N-channel FET N25 is turned on. Thus, the input terminal of the inverter I24 is maintained at the ground potential GND as it is, and the logical value "0" is output as the output signal VOUT.

When the N-channel FET N24 is turned on, the drain of the N-channel FET N24 becomes the ground potential GND, and the ground potential GND is applied to the gate of the P-channel FET P21. When the ground potential GND is applied to the gate of the P-channel FET P21, the P-channel FET P21 is turned on. When the P-channel FET P21 is turned on, the drain of the P-channel FET P21 is maintained at the high supply potential VCC. When the P-channel FET P21 is turned on, the drain of the N-channel FET N21 can be speedily brought up to the high supply potential VCC, thereby achieving a high speed operation.

On the other hand, when the level of the reset signal PORn is high, the output of the inverter I22 becomes high level, and the gate of the N-channel FET N22 becomes high level. Therefore, the N-channel FET N22 is turned on. When the N-channel FET N22 is turned on, the drain of the N-channel FET N22 becomes the ground potential GND. The ground potential GND is applied to the drain of the P-channel FET P21 through the N-channel FET N23, and is applied further to the gate of the P-channel FET P22 and the gate of the N-channel FET N24.

When the ground potential GND is applied to the gate of the P-channel FET P22, the drain of the P-channel FET P22 becomes the high supply potential VCC, and the high supply potential VCC is applied to the input terminal of the inverter I14. When the high supply potential VCC is applied to the input terminal of the inverter I24, the output of the inverter I24 becomes the low supply potential VDD, and the N-channel FET N25 is turned off. Thus, the input terminal of the inverter I24 is maintained at the high supply potential VCC as it is, thereby outputting the logical value "1" as the output signal VOUT.

Fourth Embodiment

Figure 4:
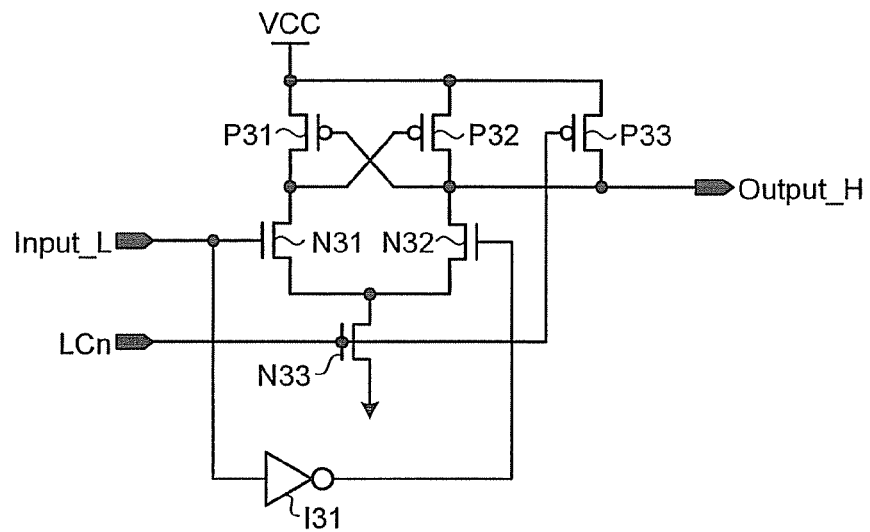
FIG. 4 is a circuit diagram of a level converting circuit to which a power-on detecting circuit according to a fourth embodiment of the present invention is applied.

FIG. 4 is a circuit diagram of a level converting circuit to which a power-on detecting circuit according to a fourth embodiment of the present invention is applied.

As shown in FIG. 4, sources of P-channel FETs P31 and P32 are connected to the high supply potential VCC. Furthermore, a drain of the P-channel FET P31 is connected to a drain of an N-channel FET N31 and a gate of the P-channel FET P32. Moreover, a drain of the P-channel FET P32 is connected to a drain of an N-channel FET N32 and a gate of the P-channel FET P31. Furthermore, sources of the N-channel FETs N31 and N32 are connected to a drain of an N-channel FET N33. A source of the P-channel FET P33 is connected to the high supply potential VCC, a drain of the P-channel FET P33 is connected to the drain of the P-channel FET P32, and a gate of the P-channel FET P33 is connected to a gate of the N-channel FET N33. Moreover, a gate of the N-channel FET N31 is connected to the gate of the N-channel FET N32 through an inverter I31.

The P-channel FETs P31 and P32 and the N-channel FETs N31 and N32 function as the level shifter that converts a low potential to a high potential. The P-channel FET P33 can function as a pull-up transistor that fixes an output potential of the level shifter to a high potential, and the N-channel FET N33 can function as a leakage-cut transistor that blocks a through current that flows in the level shifter.

To the gate of the N-channel FET N33 and the gate of the P-channel FET P33, either one of the output signals VOUT shown in FIG. 1 to FIG. 3 can be applied as an input signal LCn.

A low potential input Input_L is input to the gate of the N-channel FET N31 and to the inverter I31. Even when the high supply potential VCC has risen, if the low supply potential VDD has not risen, the logical value "0" is output as the output signal VOUT, and the N-channel FET N33 is turned off while the P-channel FET P33 is turned on. Therefore, a through current that flows through the P-channel FET P31 and the N-channel FET N31, or that flows through the P-channel FET P32 and the N-channel FET N32 can be blocked in the N-channel FET N33. In addition, the potential of the drain of the P-channel FET P32 can be pulled up to the high supply potential VCC in the P-channel FET P33, thereby maintaining a high potential output Output_H of the level shifter at the high supply potential VCC.

If the low supply potential VDD has risen when the high supply potential VCC has risen, the logical value "1" is output as the output signal VOUT, and the N-channel FET N33 is turned on while the P-channel FET P33 is turned off. When the low potential input Input_L is input to the gate of the N-channel FET N31, the N-channel FET N31 is turned on and the drain of the N-channel FET N31 becomes the ground potential GND. When the drain of the N-channel FET N31 becomes the ground potential GND, the P-channel FET P32 is turned on.

Furthermore, upon being input to the inverter I31, the low potential input Input_L is converted into the ground potential GND, to be input to the gate of the N-channel FET N32. When the ground potential GND is input to the gate of the N-channel FET N32, the N-channel FET N32 is turned off. When the P-channel FET P32 is turned on and the N-channel FET N32 is turned off, the drain of the P-channel FET P32 becomes the high supply potential VCC, and the high supply potential VCC is output as the high potential output Output_H of the level shifter.

Fifth Embodiment

Figure 5:
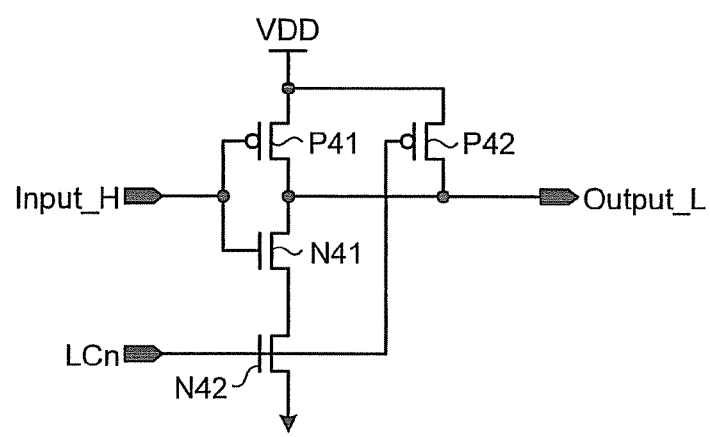
FIG. 5 is a circuit diagram of a level converting circuit to which a power-on detecting circuit according to a fifth embodiment of the present invention is applied.

FIG. 5 is a circuit diagram of a level converting circuit to which a power-on detecting circuit according to a fifth embodiment of the present invention is applied.

As shown in FIG. 5, a source of a P-channel FET P41 is connected to the low supply potential VDD, a drain of the P-channel FET P41 is connected to a drain of an N-channel FET N41, and a gate of the P-channel FET P41 and a gate of the N-channel FET N41 are connected in common. Moreover, a source of the N-channel FET N41 is connected to a drain of an N-channel FET N42, and a source of a P-channel FET P42 is connected to the low supply potential VDD. A drain of the P-channel FET P42 is connected to the drain of the P-channel FET P41, and a gate of the P-channel FET P42 and a gate of the N-channel FET N42 are connected in common.

The P-channel FET P41 and the N-channel FET N41 function as a level shifter that converts a high potential to a low potential, the P-channel FET P42 functions as a pull-up transistor that fixes an output potential of the level shifter to a low potential, and the N-channel FET N42 functions as a leakage-cut transistor that blocks a through current that flows in the level shifter.

To the gate of the N-channel FET N42 and the gate of the P-channel FET P42, either one of the output signals VOUT shown in FIG. 1 to FIG. 3 can be applied as the input signal LCn.

A high potential input Input_H is input to the gate of the P-channel FET P41 and the gate of the N-channel FET N41. Even when the low supply potential VDD has risen, if the high supply potential VCC has not risen, the logical value "0" is output as the output signal VOUT, and the N-channel FET N42 is turned off while the P-channel FET P42 is turned on. Therefore, a through current that flows through the P-channel FET P41 and the N-channel FET N41 can be blocked in the N-channel FET N42. In addition, the potential of the drain of the P-channel FET P41 can be pulled up to the low supply potential VDD in the P-channel FET P42, thereby maintaining a low potential output Output_L of the level shifter at the low supply potential VDD.

If the high supply potential VCC has risen when the low supply potential VDD has risen, the logical value "1" is output as the output signal VOUT, and the N-channel FET N42 is turned on while the P-channel FET P42 is turned off. When the high potential input Input_H is input to the gate of the N-channel FET N41, the N-channel FET N41 is turned on while the P-channel FET P41 is turned off, and the drain of the N-channel FET N41 becomes the ground potential GND. When the drain of the N-channel FET N41 becomes the ground potential GND, the ground potential GND is output as the low potential output Output_L of the level shifter.

Sixth Embodiment

Figure 6:
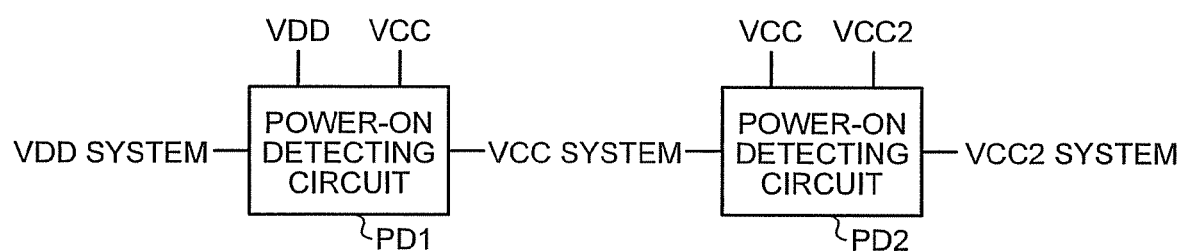
FIG. 6 is a block diagram of a power-on detecting circuit according to a sixth embodiment of the present invention.

FIG. 6 is a block diagram of a power-on detecting circuit according to a sixth embodiment of the present invention.

As shown in FIG. 6, this power-on detecting circuit includes three power sources: a VDD system that generates the low supply potential VDD, a VCC system that generates a first high supply potential VCC, and a VCC2 system that generates a second high supply potential VCC. The low supply potential VDD, the first high supply potential VCC, and the second high supply potential VCC have a relation of the low supply potential VDD<the first high supply potential VCC<the second high supply potential VCC.

A power-on detecting circuit PD1 detects a rise of both the low supply potential VDD and the first high supply potential VCC, and a power-on detecting circuit PD2 detects a rise of both the first high supply potential VCC and the second high supply potential VCC. As the power-on detecting circuits PD1 and PD2, either one of the power-on detecting circuits shown in FIG. 1 to FIG. 3 can be used.

When a rise of a potential of the low supply potential VDD, the first high supply potential VCC, and the second high supply potential VCC is to be detected, the power-on detecting circuit PD2 is connected in a subsequent stage to the power-on detecting circuit PD1, and the power-on detecting circuits PD1 and PD2 can be activated while using the output of the power-on detecting circuit of PD1 as the input of the power-on detecting circuit PD2.

When four or more power sources are present also, by connecting power-on detecting circuits in N stages (N is an integer equal to or larger than 2), a power-on detecting circuit at the Nth stage can detect a rise of potentials of four systems or more by detecting a rise of an Nth highest potential and an (N+1)th highest potential.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power-on detecting circuit comprising:
a level shifter that, when a high supply potential has risen, converts the ground potential into the high supply potential and outputs the high supply potential when a ground potential is input, and converts the high supply potential into the ground potential and outputs the ground potential when the high supply potential is input;
an input circuit that inputs the high supply potential to the level shifter when a low supply potential has not risen, and that inputs the ground potential to the level shifter when the low supply potential has risen, wherein
the input circuit includes
a voltage dropping element that is connected between an input side of the level shifter and the high supply potential;
a first latch circuit that is connected to the input side of the level shifter, that maintains output at the ground potential when the low supply potential is input, and that changes output to high impedance when the ground potential is input; and
a first capacitor that applies the ground potential to an input side of the first latch circuit when the low supply potential has not risen, and the output circuit includes
a second latch circuit that is connected to the output side of the level shifter, and that maintains input as it is to be output when the low supply potential has risen; and
a second capacitor that applies the ground potential to an input side of the second latch circuit when the high supply potential has not risen; and
an output circuit that is connected on an output side of the level shifter, and that outputs the ground potential when the high supply potential has not risen.

2. The power-on detecting circuit according to claim 1, wherein the voltage dropping element is a resistor.

3. The power-on detecting circuit according to claim 1, wherein the first latch circuit includes:
a first N-channel field effect transistor (FET) having a drain connected to a terminal of the first capacitor, and having a gate connected to the input side of the level shifter; and
a second N-channel FET having a gate connected to the terminal of the first capacitor, and having a drain connected to the input side of the level shifter.

4. The power-on detecting circuit according to claim 1, wherein the second latch circuit includes:
an N-channel FET having a drain connected to the output side of the level shifter; and
an inverter having an input terminal connected to the output side of the level shifter, and having an output terminal connected to a gate of the N-channel FET.

5. The power-on detecting circuit according to claim 1, further comprising a driving transistor that pulls the input side of the level shifter up to the high supply potential by being turned off when the low supply potential has risen, and by being turned on when the high supply potential has risen while the low supply potential has not risen.

6. The power-on detecting circuit according to claim 5, wherein the driving transistor is connected between the input side of the level shifter and the high supply potential, and is controlled to be turned on and off based on output of the level shifter.

7. The power-on detecting circuit according to claim 6, further comprising an N-channel FET arranged between the input side of the level shifter and an output side of the first latch circuit, and having a gate connected to the low supply potential.

8. The power-on detecting circuit according to claim 1, further comprising a driving circuit that pulls the input side of the level shifter up to the high supply potential by being turned off when the low supply potential has risen, and by being turned on when the high supply potential has risen while the low supply potential has not risen, wherein
the driving circuit includes
a first P-channel FET having a source connected to the high supply potential, and a drain connected to the input side of the level shifter;
a second P-channel FET having a source connected to the high supply potential;
a first N-channel FET having a drain connected to a drain of the first P-channel FET and to a gate of the second P-channel FET, and having a gate connected to a drain of the second P-channel FET; and
a second N-channel FET having a drain connected to a the drain of the second P-channel FET and to a gate of the second first P-channel FET, and having a gate connected to the drain of the first P-channel FET.

9. The power-on detecting circuit according to claim 8, further comprising:
a third N-channel FET having a drain connected to the drain of the second N-channel FET, and having a source connected to a source of the first N-channel FET; and
a fourth N-channel FET having a drain connected to the source of the third N-channel FET, and having a gate connected to the low supply potential.

10. The power-on detecting circuit according to claim 1, further comprising:
a first inverter that is connected to a preceding stage to the input circuit; and
a second inverter that is connected in a preceding stage to the first inverter.

11. The power-on detecting circuit according to claim 1, wherein the low supply potential is input to the input circuit.

12. The power-on detecting circuit according to claim 1, wherein a reset signal that functions after the low supply potential has risen is input to the input circuit.

* * * * *